US010872641B2

(12) United States Patent
Schreiber et al.

(10) Patent No.: US 10,872,641 B2
(45) Date of Patent: Dec. 22, 2020

(54) NWELL AND SUBTRATE TAPS IN MEMORY LAYOUT

(71) Applicant: Advanced Micro Devices, Inc., Santa Clara, CA (US)

(72) Inventors: Russell Schreiber, Austin, TX (US); Keith A. Kasprak, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/454,692

(22) Filed: Jun. 27, 2019

(65) Prior Publication Data

US 2020/0335142 A1 Oct. 22, 2020

Related U.S. Application Data

(60) Provisional application No. 62/837,025, filed on Apr. 22, 2019.

(51) Int. Cl.

| *G11C 7/06* | (2006.01) |
| *G11C 11/412* | (2006.01) |
| *G11C 11/419* | (2006.01) |
| *H01L 27/11* | (2006.01) |

(52) U.S. Cl.
CPC .............. *G11C 7/06* (2013.01); *G11C 11/412* (2013.01); *G11C 11/419* (2013.01); *H01L 27/1104* (2013.01)

(58) Field of Classification Search
CPC ....... G11C 7/06; G11C 11/412; G11C 11/419; H01L 27/1104
See application file for complete search history.

(56) References Cited

U.S. PATENT DOCUMENTS

| 6,376,884 | B1* | 4/2002 | Hotta | ................... | H01L 27/1104 |
| | | | | | 257/379 |
| 6,845,051 | B2* | 1/2005 | Komura | .................... | G11C 7/06 |
| | | | | | 365/203 |
| 7,349,240 | B2* | 3/2008 | Oki | ........................ | G11C 11/413 |
| | | | | | 257/E21.661 |

* cited by examiner

*Primary Examiner* — Tri M Hoang
(74) *Attorney, Agent, or Firm* — Polansky & Associates, P.L.L.C.; Paul J. Polansky; Nathan H. Calvert

(57) ABSTRACT

A circuit includes a repeating series of first circuits and a repeating series of second circuits placed next to the repeating series of first circuits and interacts with corresponding portions of the first circuits in the series. The repeating series of second circuits is formed in diffusion regions and diffusion wells which extend along the direction in which the second circuits repeat. The repeating series of the first and second circuits is interrupted by at least one dummy circuit region, which occupies the space of one or more instances of the first and second repeating series. The dummy circuit region also includes taps for biasing the diffusion regions and diffusion wells of the second circuits.

20 Claims, 4 Drawing Sheets

NWELL AND SUBTRATE TAPS IN MEMORY LAYOUT

BACKGROUND

A latch-up failure in an integrated circuit chip (IC) is the inadvertent creation of a low-impedance path or short circuit between the power supply rails of the circuit. Latch-up is traditionally avoided by placing "taps" in the transistor structure, including an extra diffusion region with a low impedance path from the transistor well or substrate to a desired bias voltage, usually the positive or negative power supply rail. Latch-up may also occur even when a circuit includes taps, because excessive spacing of the taps can result in too much resistance along the path from the transistor to the tap which connects the well or substrate to its desired bias voltage.

Many static random access memory (SRAM) senseamp and write driver circuitry includes long, vertical wells that span the length of a subarray of memory circuitry. The well/substrate taps are connected at just the top/bottom of the subarray, which is what has been done for many technology generations. However, as transistor sizes shrink with new technologies such as 5 nm sized devices, the maximum distance allowed for tap spacing has decreased. This more conservative tap spacing is a result of increased well/substrate resistance and increased tap resistance in new manufacturing nodes. For senseamp and write driver circuitry, the maximum distance to a tap may now be smaller than the half the size of a subarray, meaning taps at the top and bottom of a subarray are no longer sufficient to property bias the wells and diffusion regions to avoid latch-up.

A typical solution to the problem is to place taps in the column circuitry for every logical bit. However, with such solutions, the added substrate and well taps to every logical column's senseamp and write driver region is very expensive in terms of area. Another solution is to split the array using full edge cells which is also very expensive from an area perspective.

Figure 1:
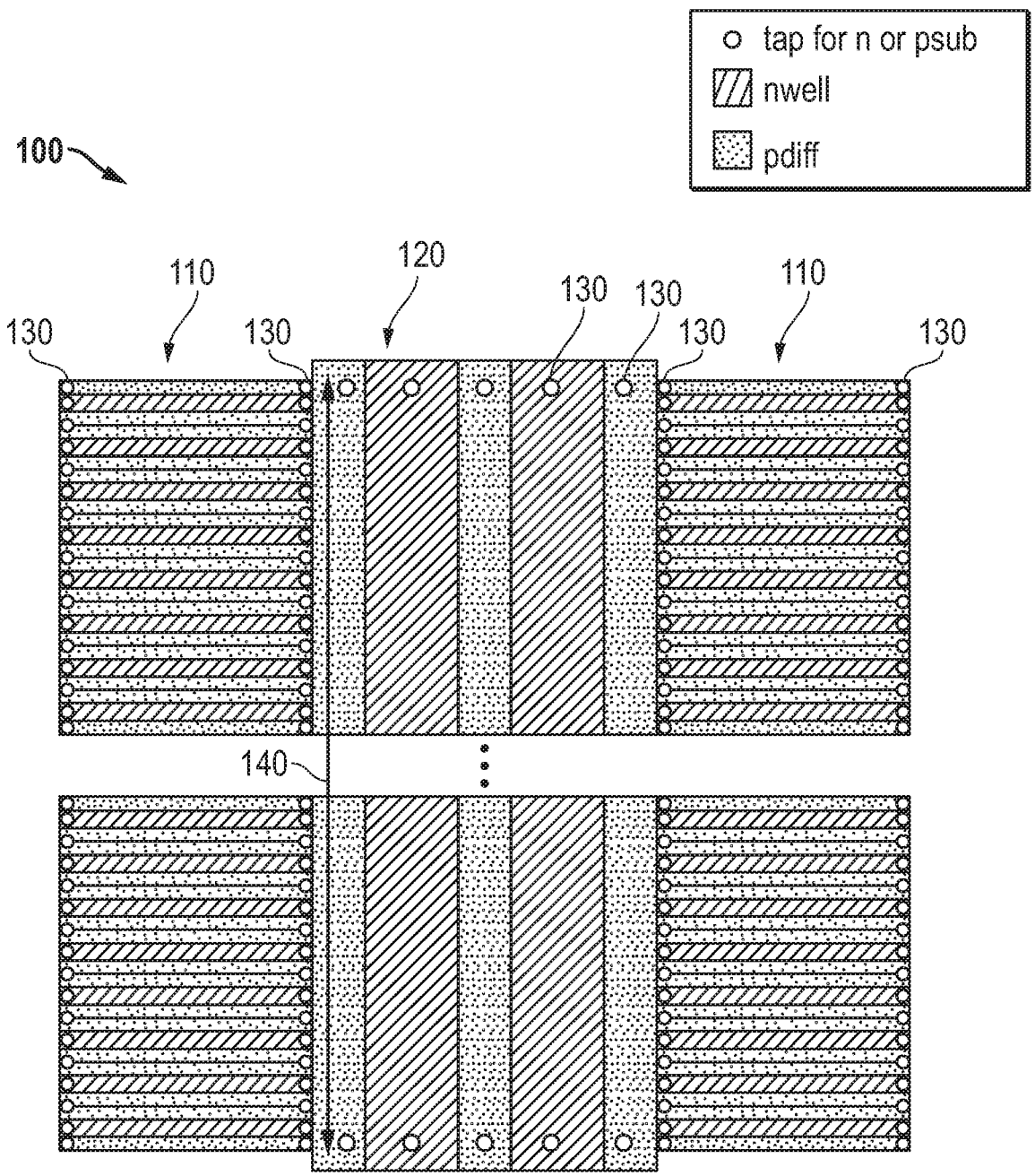
FIG. 1 shows in diagram form a layout of an implant layer of an SRAM memory senseamp and write driver region according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

An integrated circuit chip includes a repeating series of first circuits, a repeating series of second circuits, and a dummy circuit region. The repeating series of first circuits extends along a first direction in which the first circuits repeat. The repeating series of second circuits placed next to the repeating series of first circuits and formed along diffusion regions and wells which extend in the first direction. The second circuits interact with corresponding portions of the first circuits. The dummy circuit region interrupts the repeating series of second circuits and the repeating series of first circuits, and does not include a functioning instance of the first or second circuits. The dummy circuit region includes taps tying the diffusion regions and wells to power supply voltages.

A circuit includes a repeating series of first circuits, a repeating series of second circuits, and a dummy circuit region. The repeating series of first circuits extends along a first direction in which the first circuits repeat. The repeating series of second circuits placed next to the repeating series of first circuits and formed along diffusion regions and wells which extend in the first direction. The second circuits interact with corresponding portions of the first circuits. The dummy circuit region interrupts the repeating series of second circuits and the repeating series of first circuits, and does not include a functioning instance of the first or second circuits. The dummy circuit region includes taps tying the diffusion regions and wells to power supply voltages.

A method includes operating a repeating series of first circuits and operating a repeating series of second circuits placed next to the repeating series of first circuits, the second circuits interacting with corresponding portions of the first circuits. At a dummy circuit region interrupting the repeating series of first circuits and the repeating series of second circuits, the method includes biasing diffusion regions and wells which extend along a direction in which the second circuits repeat, the diffusion regions biased to power supply voltages.

FIG. 1 shows in diagram form a partial layout 100 showing the n and p type substrate regions of memory bitcells and a memory senseamp and write driver region of an SRAM circuit according to the prior art. The layout is simplified to show only the nwell (n-type diffusion well) and pdiff (p-diffusion substrate) regions and the locations of tap cells, excluding the doped P and N sources and drains of individual transistors in the circuitry. The regions are not drawn to scale, and are meant to show the relative positions only. Two groups of columns of memory bitcells 110 are shown, with a central row of sensamp and write driver circuitry 120 (the drawing is oriented with "rows" shown vertically and "columns" horizontally). Taps 130 are designated by the circles. In the prior art, taps 130 are present on each of the bitcell columns 110 at the edge cells, and at both ends of the row of sensamp and write driver circuitry 120. For a typical amount of columns in memory circuits, about 160, the spacing between the taps, given by the arrow 140, is less than the maximum allowed tap spacing.

Figure 2:
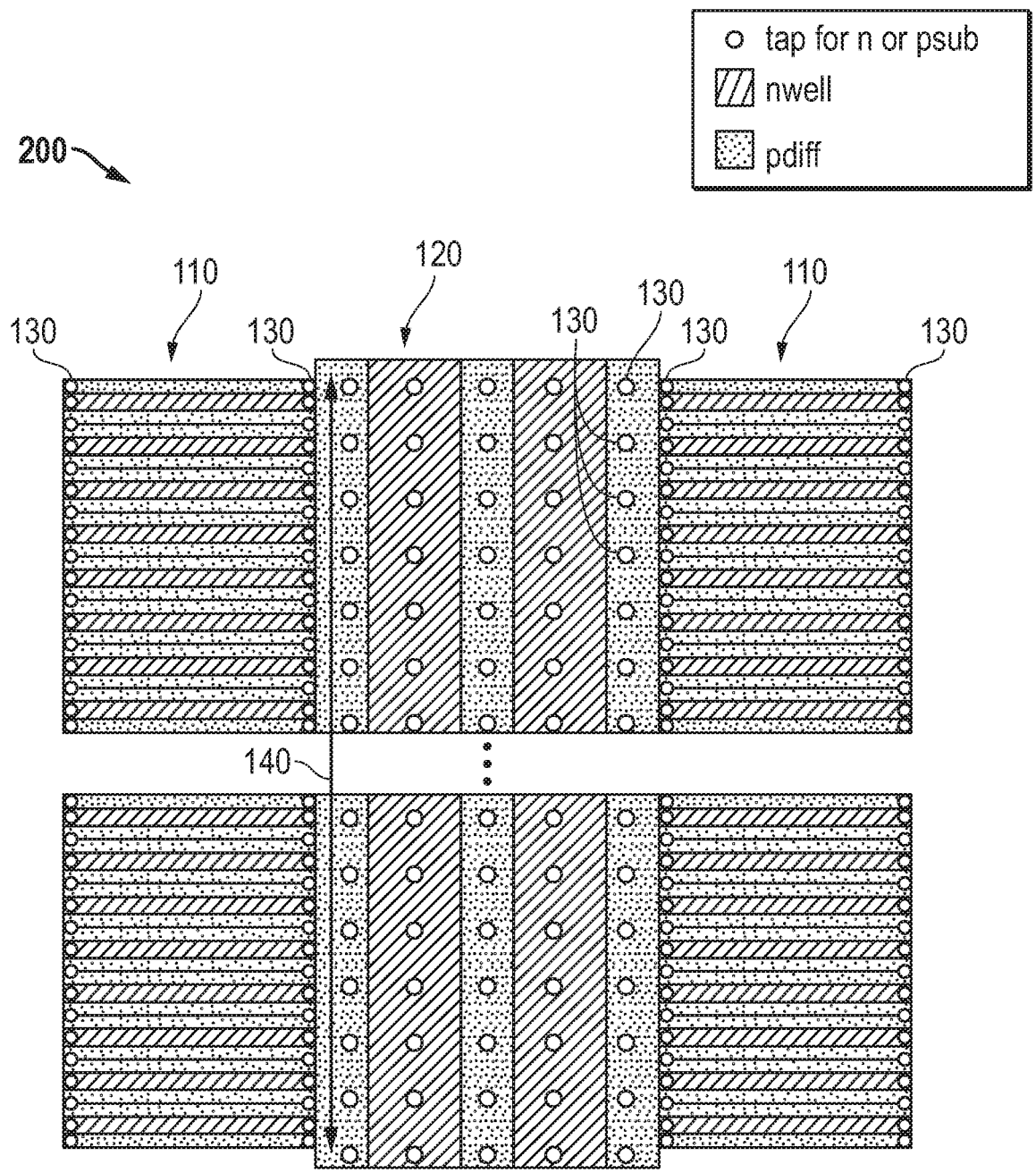
FIG. 2 shows in diagram form a partial layout showing n and p type doped Si regions of an SRAM memory senseamp and write driver region according to another example of the prior art.

FIG. 2 shows in diagram form a partial layout 200 showing n and p type substrate regions of memory bitcells and a memory senseamp and write driver region of another SRAM circuit according to the prior art. In this version, each logical column of the senseamp and write driver circuitry 120 is provided with five taps 130, one in each well or isolated substrate diffusion area. Such a design might be used, for example, with a 5 nm technology in which tap spacing is required to be less than two times the array height. Because the taps 130 are included in logical columns along with the functioning senseamp and drive circuitry, the size of the logical columns is enlarged or bloated in the X direction of FIG. 2.

Figure 3:
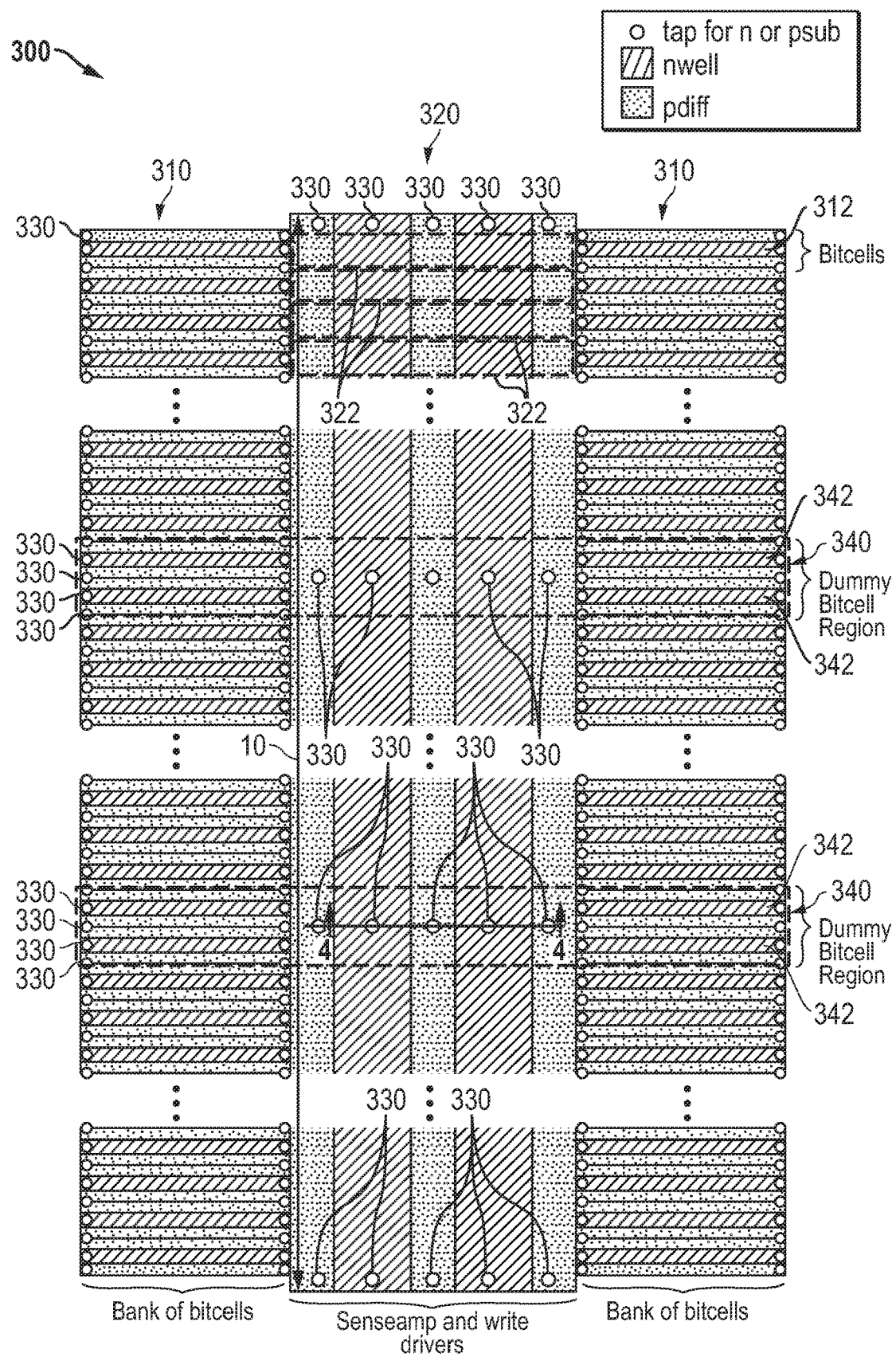
FIG. 3 shows in diagram form a partial layout showing n and p type doped Si regions of an SRAM memory senseamp and write driver region according to some embodiments.

FIG. 3 shows in diagram form a partial layout showing n and p type substrate regions of a sub-array 300 of memory bitcells and a memory senseamp and write driver region of an SRAM circuit according to some embodiments. Again, the layout is simplified to show only the nwell and pdiff regions, as shown by the legend, and the locations of tap cells, excluding the doped P-type and N-type sources and drains of individual transistors in the sub-array 300. The regions are not drawn to scale, and are meant to show the relative positions only. Two groups 310 of columns of memory bitcells 312 are shown, with a central row 320 of multiple senseamp and write driver circuits 322 (the drawing is oriented with logical "rows" shown vertically and columns horizontally). While only four senseamp and write driver circuits 322 are shown for clarity, the circuits repeat along the length of central row 320, except where interrupted by dummy bitcell regions 340 as described below. Tap cells 330 are designated by the circles. Bitcells 312 include nfets (N-type field effect transistors, not shown individually) constructed in the pdiff regions on outside edges of each bitcell 312, and pfet (P-type field effect transistors, also not shown individually) constructed in the nwell regions along the inside of bitcells 312. Tap cells 330 for bitcells 312 are embedded in edge cells along the end edges of the bitcell columns as shown.

In this embodiment, taps cells 330 are not included in most of the central row 320 of read and write circuits 322, avoiding the use of added space required to include taps amongst the senseamp and write driver circuitry. Instead, taps are added at one or more dummy bitcell regions 340 as designated by the dotted boxes. Dummy bitcell regions 340 do not contain functioning bitcells, senseamp, or write driver circuitry, and instead provide an area where taps 330 can be placed to maintain the desired bias of the nwell and pdiff regions along central row 320. Circuitry of bitcells 312 may be present in the dummy bitcell region 340, but not used. Any such unused circuitry may be configured with its power supply conductors tied off, with conductors for both power supply rails within the dummy bitcell area connected to the more negative power supply voltage or VSS to avoid extra leakage from dummy bitcell columns.

In this embodiment, each dummy bitcell region 340 is the height of two memory bitcells 312, although other versions may provide the dummy bitcell regions which are which are the height of 1, 3 or more bitcells. Dummy bitcell regions 340 extend across the central row 320 of senseamp and write driver circuits 322. In the area of central row 320 where two instances of the senseamp and write driver circuits 322 would be included for accessing functioning bitcells, the additional taps cells 330 are placed instead. While five additional tap cells 330 are shown, this is not limiting, and preferably as many tap cells as can be placed in the area created by the dummy bitcell region 340 are used. Each of the vertical nwell and pdiff regions in central row 320 will have at least one tap cell 330 within dummy bitcell region 340.

As shown by the ellipses, there actually much more area than depicted in the subarray (more bitcell columns) before a dummy bitcell region 340. In a typically sub-array of an SRAM circuit, up to hundreds of columns are present, but this may vary based on the application. The height 10 of the depicted sub-array 300, as shown measured along the central row 320, determines how many dummy bitcell regions 340 are required for a particular technology node. If the spacing between taps along the direction of height 10 is greater than twice the maximum allowed spacing for usual amount of columns in the sub-array 300 when placed at top/bottom of subarray, then dummy bitcell regions 340 are used. Preferably, dummy bitcell regions 340 are placed equidistantly such that no part of central row 320 is more than the maximum distance away from a tap cell 330 in its surrounding nwell or pdiff area.

While in this version, two groups 310 of columns of memory bitcells 312 are shown with a central row 320 of senseamp and write driver circuitry, in other embodiments these may be replaced with a repeating series of first circuits and a repeating series of second circuits placed next to the repeating series of first circuits and interacting with corresponding portions of the first circuits in the series. In this example, the repeating series of first circuits is memory bitcell columns, and the repeating series of second circuits is senseamp and write driver circuits. The repeating series of second circuits is formed in diffusion regions and wells such as those shown in senseamp and write driver circuits in central row 320, which extend in the direction in which the second circuits repeat. Biasing of n-type diffused regions and p-type diffused regions includes taps placed along edges of the region. The repeating series of the first and second circuits are interrupted by at least one dummy circuit region, in this example a dummy bitcell region, which occupies the space of one or more instances of the first and second repeating series. The dummy circuit region preferably does not include functioning instances of first circuits or functioning instances of second circuits. The dummy circuit region includes at least n-wells and p-type diffusion regions (or p-wells and n-type diffusion regions) that are part of or contiguous with those of the repeating series of second circuits. The dummy circuit region also includes taps for biasing the n-wells to the more positive power supply rail and the p-type diffusion regions to the more negative power supply rail.

Preferably the repeating series of second circuits does not include taps between its outer edges and the dummy circuit regions. The dummy circuit regions are preferably placed along the length of the repeating series of second circuits such that no part of the repeating series of second circuits is more than the maximum distance away from a tap in its surrounding nwell or pdiff area.

Some embodiments may take the form of an integrated circuit chip such as an SRAM chip, a DRAM chip, or a processor chip with integrated memory such as cache memory or onboard system memory. Some embodiments may not include a repeating series of first circuits such as the bitcells herein, and instead provide a dummy circuit region that replaces one or more instances of a single series of repeating circuitry.

Figure 4:
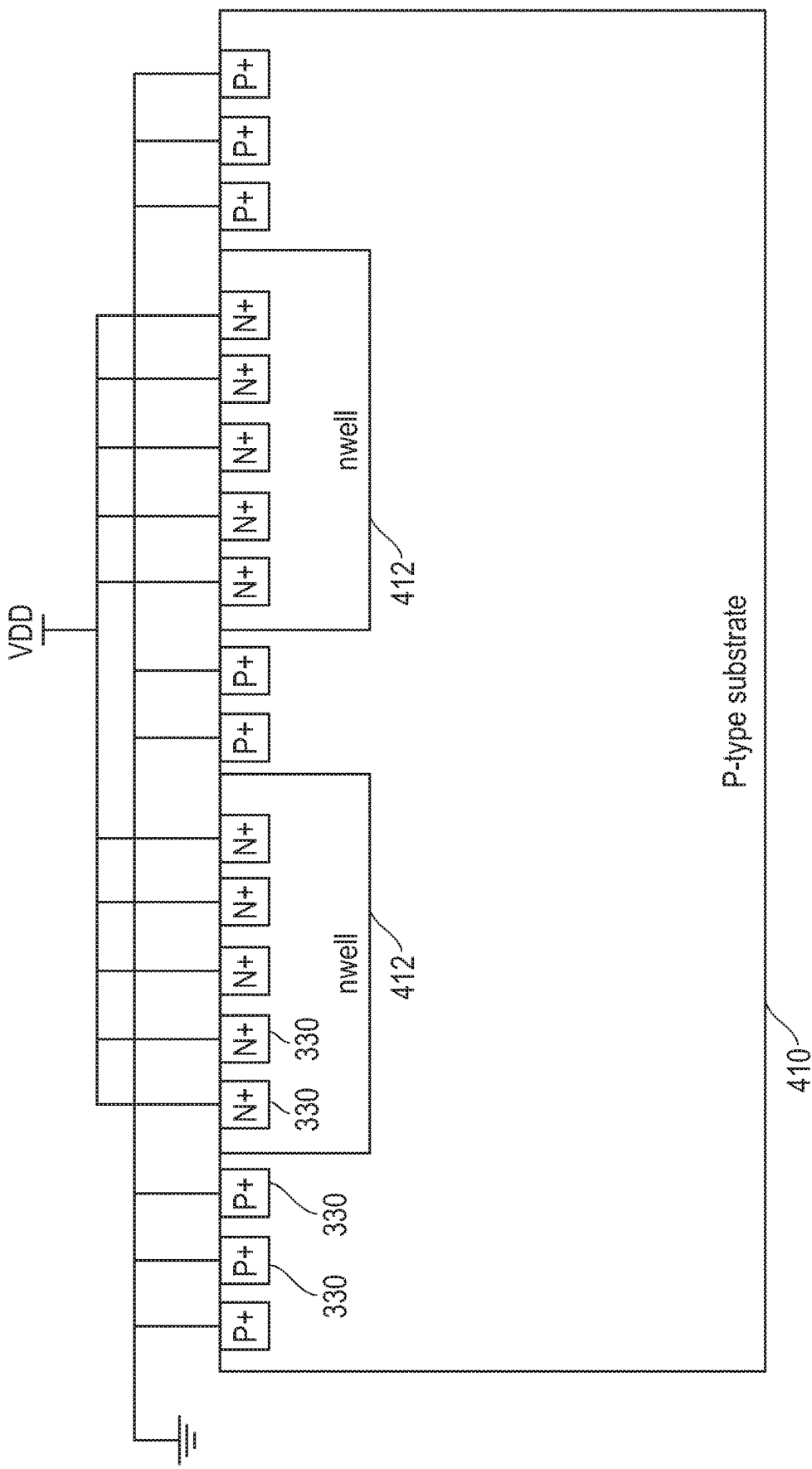
FIG. 4 shows in diagram form a cross section of a partial dummy bitcell region according to some embodiments.

FIG. 4 shows in diagram form a cross section of a partial dummy bitcell region according to some embodiments taken along the line 4-4 in FIG. 3. Tap cells 330 are shown along areas of p-type substrate (pdiff) and n-type wells (nwell). The pdiff substrate regions 410 are connected to the more negative supply rail or ground though tap cells 330. Nwell regions 412 are similarly connected with tap cells 330 to the more positive supply rail or VDD. Preferably, as many tap cells 330 as can fit in each area is used, to lower the impedance of the connection. Tap cells 330 are constructed as known in the art, as a diffusion or implant feature of the same dopant type as the surrounding well or substrate. That is, p+ type implant regions form tap cells 330 into pdiff substrate regions 410, and n+ type implant regions form tap cells 330 into nwell regions 412. Power supply and ground connections to tap cells 330 are preferably made with a suitable metal as used for the surrounding circuitry.

While the depicted cross section shows a dummy region interrupting a central row 320 of sense amp and drive circuitry, in other versions similar tap arrangements may be used with a dummy circuitry region interrupting other arrangements of first and second repeating circuitry. Furthermore, while tap cells are shown, any suitable form of tap structure may be used, including taps that are larger than standard cell sizes for the technology node employed in constructing the host circuit. The taps are preferably constructed as tap cells sized similarly to the feature size of transistors in the surrounding circuitry. The taps may be connected to the power supply rails with metal or polysilicon interconnects.

The circuits described herein, or portions thereof may be described or represented by a computer accessible data structure in the form of a database or other data structure which can be read by a program and used, directly or indirectly, to fabricate integrated circuit chips. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, various types of repeating circuitry may benefit from the techniques herein, including various types of memory and logic circuitry.

Accordingly, it is intended by the appended claims to cover all modifications of the disclosed embodiments that fall within the scope of the disclosed embodiments.

What is claimed is:

1. An integrated circuit chip comprising:
   a repeating series of first circuits extending along a first direction in which the first circuits are repeated;
   a repeating series of second circuits placed next to the repeating series of first circuits and formed along diffusion regions and wells which extend in the first direction, the second circuits interacting with corresponding portions of the first circuits; and
   a dummy circuit region interrupting the repeating series of second circuits and the repeating series of first circuits at an interior location along each series with pluralities of the first and second circuits before and after the interior location along each respective series, the dummy circuit region not including a functioning instance of the first or second circuits, and including taps tying the diffusion regions and wells to power supply voltages.

2. The integrated circuit chip of claim 1, wherein the repeating series of first circuits comprises memory bitcells, and the repeating series of second circuits comprises senseamp and write driver circuits.

3. The integrated circuit chip of claim 2, further comprising a repeating series of memory bitcells disposed in a third region at an opposite side of the repeating series of second circuits from the repeating series of first circuits, and wherein the dummy circuit region spans the third region.

4. The integrated circuit chip of claim 1, wherein the dummy circuit region includes a non-functioning instance of the first circuits.

5. The integrated circuit chip of claim 4, wherein the dummy circuit region includes two or more non-functioning instances of the first circuits.

6. The integrated circuit chip of claim 4, wherein the non-functioning instance of the first circuits has positive and negative power supply conductors coupled to a more negative power supply rail.

7. The integrated circuit chip of claim 1, wherein the dummy circuit region includes multiple taps in each of the diffusion regions and wells.

8. A circuit comprising:
   a repeating series of first circuits extending along a first direction in which the first circuits are repeated;
   a repeating series of second circuits placed next to the repeating series of first circuits and formed along diffusion regions and wells which extend in the first direction, the second circuits interacting with corresponding portions of the first circuits; and
   a dummy circuit region interrupting the repeating series of second circuits and the repeating series of first circuits at an interior location along each series with pluralities of the first and second circuits before and after the interior location along each respective series, the dummy circuit region not including a functioning instance of the first or second circuits, and including taps tying the diffusion regions and wells to power supply voltages.

9. The circuit of claim 8, wherein the repeating series of first circuits comprises memory bitcells, and the repeating series of second circuits comprises senseamp and write driver circuitry.

10. The circuit of claim 9, further comprising a repeating series of memory bitcells disposed in a third region at an opposite side of the repeating series of second circuits from the repeating series of first circuits, and wherein the dummy circuit region spans the third region.

11. The circuit of claim 8, wherein the dummy circuit region includes a non-functioning instance of the first circuits.

12. The circuit of claim 11, wherein the dummy circuit region includes two or more non-functioning instances of the first circuits.

13. The circuit of claim 11, wherein the non-functioning instance of the first circuits has positive and negative power supply conductors tied off to a more negative power supply rail.

14. The circuit of claim 8, wherein the dummy circuit region includes multiple taps in each of the diffusion regions and wells.

15. A method comprising:
   operating a repeating series of first circuits extending along a first direction in which the first circuits are repeated;
   operating a repeating series of second circuits placed next to the repeating series of first circuits, the second circuits interacting with corresponding portions of the first circuits; and
   at a dummy circuit region which interrupts the repeating series of first circuits and the repeating series of second circuits at an interior location along each series with pluralities of the first and second circuits before and after the interior location along each respective series, biasing diffusion regions and wells which extend in the first direction, the diffusion regions biased to power supply voltages.

16. The method of claim 15, wherein the repeating series of first circuits comprises memory bitcells, and the repeating series of second circuits comprises senseamp and write driver circuitry.

17. The method of claim 16, wherein the dummy circuit region spans a third region comprising a repeating series of memory bitcells disposed at an opposite side of the repeating series of second circuits from the repeating series of first circuits.

18. The method of claim 15, wherein the dummy circuit region includes a non-functioning instance of the first circuits.

19. The method of claim 18, wherein the dummy circuit region includes two or more non-functioning instances of the first circuits.

20. The method of claim 15, wherein biasing diffusion regions and wells includes biasing with multiple taps in each of the diffusion regions and wells.

* * * * *